(12) United States Patent
Nakai

(10) Patent No.: US 9,048,622 B2
(45) Date of Patent: Jun. 2, 2015

(54) HIGH POWER PULSED LIGHT GENERATION DEVICE

(71) Applicant: FUJIKURA LTD., Koto-ku, Tokyo (JP)

(72) Inventor: Michihiro Nakai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/158,250

(22) Filed: Jan. 17, 2014

(65) Prior Publication Data

US 2014/0268313 A1   Sep. 18, 2014

Related U.S. Application Data

(63) Continuation of application No. PCT/JP2012/068240, filed on Jul. 18, 2012.

(30) Foreign Application Priority Data

Jul. 20, 2011   (JP) .................. 2011-158847

(51) Int. Cl.
*H01S 3/094* (2006.01)
*H01S 3/102* (2006.01)
(Continued)

(52) U.S. Cl.
CPC ......... *H01S 3/094026* (2013.01); *H01S 3/0941* (2013.01); *H01S 3/06754* (2013.01); *H01S 3/1024* (2013.01); *H01S 3/1618* (2013.01); *H01S 3/2308* (2013.01); *H01S 5/042* (2013.01); *H01S 3/094076* (2013.01); *B23K 26/00* (2013.01); *H01S 5/0428* (2013.01)

(58) Field of Classification Search
CPC .................................... H01S 3/2308

USPC ............................................................ 372/6
See application file for complete search history.

(56) References Cited

U.S. PATENT DOCUMENTS 5,283,794 A * 2/1994 Gibbs et al. .................. 372/30
5,325,383 A * 6/1994 Davis et al. .................. 372/26
(Continued)

FOREIGN PATENT DOCUMENTS

EP   1971004 A2   9/2008
EP   2363927 A2   9/2011
(Continued)

OTHER PUBLICATIONS

International Search Report for PCT/JP2012/068240, dated Aug. 28, 2012.
(Continued)

*Primary Examiner* — Ari M Diacou
(74) *Attorney, Agent, or Firm* — Sughrue Mion, PLLC

(57) ABSTRACT

A high power pulsed light generation device includes: a master clock generator that generates a master signal; an optical oscillator that generates a pulsed light synchronized with the master clock signal; an optical amplifier that amplifies the pulsed light emitted from the optical oscillator to output a high power pulsed light; a pump semiconductor laser that generates a pulsed light for pumping the optical amplifier; a driving unit that drives the pump semiconductor laser by a pulsed driving current synchronized with the master clock signal; and a control unit which controls the driving unit and controls a gain of the optical amplifier for each pulse by changing a pulse width of the pulsed drive current from driving unit so as to change the pulse width of the pumping pulsed light.

5 Claims, 8 Drawing Sheets

(51) Int. Cl.
*H01S 3/23* (2006.01)
*H01S 5/042* (2006.01)
*H01S 3/0941* (2006.01)
*H01S 3/067* (2006.01)
*H01S 3/16* (2006.01)
*B23K 26/00* (2014.01)

(56) References Cited

U.S. PATENT DOCUMENTS

| | | | |
|---|---|---|---|
| 5,867,305 A * | 2/1999 | Waarts et al. | 359/337.12 |
| 5,930,030 A * | 7/1999 | Scifres | 359/341.3 |
| 5,933,271 A | 8/1999 | Waarts et al. | |
| 6,081,369 A | 6/2000 | Waarts et al. | |
| 6,181,463 B1 * | 1/2001 | Galvanauskas et al. | 359/330 |
| 7,477,667 B2 * | 1/2009 | Liu | 372/25 |
| 7,565,084 B1 * | 7/2009 | Wach | 398/201 |
| 7,872,794 B1 * | 1/2011 | Minelly et al. | 359/341.31 |
| 8,238,390 B2 * | 8/2012 | Deladurantaye et al. | 372/25 |
| 8,760,755 B2 * | 6/2014 | Schill et al. | 359/341.4 |
| 2004/0017603 A1 | 1/2004 | Jay et al. | |
| 2004/0134896 A1 * | 7/2004 | Gu et al. | 219/121.69 |
| 2005/0225846 A1 * | 10/2005 | Nati et al. | 359/341.1 |
| 2006/0029111 A1 * | 2/2006 | Liu | 372/6 |
| 2006/0120418 A1 * | 6/2006 | Harter et al. | 372/30 |
| 2008/0013163 A1 * | 1/2008 | Leonardo et al. | 359/341.31 |
| 2008/0094605 A1 * | 4/2008 | Drodofsky et al. | 356/4.01 |
| 2009/0010288 A1 * | 1/2009 | Keaton et al. | 372/25 |
| 2009/0310627 A1 * | 12/2009 | Chen et al. | 372/6 |
| 2012/0263198 A1 * | 10/2012 | Oba et al. | 372/6 |

FOREIGN PATENT DOCUMENTS

| | | |
|---|---|---|
| JP | 2011-100954 A | 5/2011 |
| JP | 2011-134735 A | 7/2011 |

OTHER PUBLICATIONS

Communication dated Mar. 24, 2015 issued by the Japanese Patent Office in counterpart Japanese Application No. 2011-158847.
Communication dated Feb. 9, 2015, issued by the European Patent Office in corresponding European Application No. 12814806.1.
Communication dated Mar. 23, 2015, issued by the State Intellectual Property Office of the Republic of China in corresponding application No. 201280034919.1.

* cited by examiner

HIGH POWER PULSED LIGHT GENERATION DEVICE

CROSS REFERENCE TO RELATED APPLICATIONS

This application is a continuation application based on a PCT Patent Application No. PCT/JP2012/068240, filed Jul. 18, 2012, whose priority is claimed on Japanese Patent Application No. 2011-158847, filed Jul. 20, 2011, the entire content of which are hereby

TECHNICAL FIELD BACKGROUND OF THE INVENTION

1. Field of the Invention

The present invention relates to a high power pulsed light generation device that emits light obtained by amplifying a pulsed light emitted from a pulsed light source in an optical amplifier using a semiconductor laser as a pumping light source of the optical amplifier, and particularly relates to a high power pulsed light generation device which is suitable for laser processing.

2. Description of the Related Art

In general, as a high power pulsed light generation device having a function of pulsed light amplification, there are many devices, using a semiconductor laser (laser diode: LD) of a fiber output as a pumping light source of an optical amplifier, which are provided with an optical oscillator used as a pulsed light source and the optical amplifier that amplifies a pulsed light output from the optical oscillator.

In addition, in an LD for pumping of an optical amplifier (hereinafter, referred to as a pump LD), in many cases, there is provided a shunt type constant current driving circuit which is a highly precise resistor having a small resistance value, and the output of the pump LD is normally controlled to be constant by attached drivers.

However, in the circuit driving such a pump LD, an output current is optimized to be constant for a time period from 1 sec to 1 hr.

Accordingly, response time of the driving circuit is designed to be 1 msec or greater in many cases and it is difficult to turn on and turn off output light emitted from the pump LD at high speed.

Meanwhile, in order to facilitate reduced losses in a device in which a power circuit or a power supply circuit uses a constant voltage circuit, a constant voltage circuit applying a switching element which is enabled to perform pulse driving of the pump LD has been used.

As disclosed in prior art documents, a method of controlling an output waveform of a pump LD to be pulsed by performing the pulse driving of a driving current has also been known (for example, refer to U.S. Pat. Nos. 5,325,383 and 5,283,794).

Further, in the high power pulsed light generation device, in order to efficiently amplify a pulsed light (hereinafter, referred to as an oscillation pulsed light) emitted from an optical oscillator, there are techniques that perform the pulse driving of a pump LD disclosed in, for example, U.S. Pat. Nos. 5,867,305, 5,933,271, and 6,081,369.

In addition, a technology to improve a gain of an optical amplifier by changing the waveform of a driving current value of the pump LD to be a pulsed waveform and synchronizing the signal frequency of a pulsed laser light source with the frequency of a pulse output of the pump LD has also been known.

However, in the practical laser process, generally, an operation in which the high power pulsed light generation device continuously emits the pulsed light for processing only for a certain time; and temporarily stops the output of the pulsed light; and then, emits the pulsed light again, is repeated.

Here, a state where the output pulsed light is continuously emitted from the high power pulsed light generation device is referred to as an ON state and a state where the emission of the output pulsed light from the high power pulsed light generation device stops is referred to as an OFF state.

The change between the ON and OFF states of the high power pulsed light generation device is generally controlled by turning on and off a pulsed driving current of a pump LDs (pump LD) that generates pulsed light for pumping the optical amplifier (hereinafter, referred to as pulsed light for pumping).

Accordingly, the high power pulsed light generation device is in an OFF state when the pulsed driving current does not flow through the pump LDs and the high power pulsed light generation device is in an ON state when the pulsed driving current flows through the pump LDs.

It is also noted that the pulsed light for pumping is synchronized with the pulsed driving current, a pulse width of each pulse of the pulsed driving current of the pulsed light for pumping is generally constant, and in general, a pulse width of the pulsed light for pumping is sufficiently set longer than a pulse width of the output pulsed light.

In a case where such a high power pulsed light generation device of the pulse driving is used, just after the state of the high power pulsed light generation device is changed from the OFF state to the ON state, the gain of the optical amplifier for each pulse in the high power pulsed light generation device gradually increases from lower value to stable and higher value.

In addition, when increasing the gain of the optical amplifier for the pulse immediately after the change to the ON state in order to shorten the time until the gain reaches the stable state, the gain for the pulse may become excessive and overshot.

As stated above, there has been a problem that the gain of the optical amplifier for each pulse is not stable immediately after changing the state of the high power pulsed light generation device from the OFF state to the ON state, and as a result, the power of each individual pulse, which is output from the high power pulsed light generation device, is not stable.

Further, as stated above, a period until the power of the output pulsed light is stabilized after changing the state of the high power pulsed light generation device from the OFF state to the ON state is referred to as a transient period in the present invention, and a phenomenon causing fluctuation of the power of the output pulsed light for each pulse within the transient period is referred to as a transient phenomenon.

In particular, when using the high power pulsed light generation device as a light source of a laser processing device, the fluctuation of the power of the output pulsed light in the above-described transient period is a factor for enlarging the variation of processing properties such as a processing quality or the degree of processing in the laser processing.

Accordingly, in the transient period, it is necessary to hold the device on standby without performing the laser processing.

Such a standby period deteriorates operation efficiency of the laser processing device.

However, it has not been considered in any Patent documents described above to suppress the fluctuation of peak power of the output pulsed light due to the transient phenomenon when changing the state of the high power pulsed light generation device from the OFF state to the ON state.

Accordingly, in the high power pulsed light generation device of the conventional art, it is difficult to obtain an output pulsed light where the peak power is even immediately after the change when changing the state of the high power pulsed light generation device from the OFF state to the ON state.

Therefore, it has been difficult to avoid the deterioration of the operation efficiency of the high power pulsed light generation device due to the standby period as described above.

FIG. 7 shows a time chart of, a pulsed pumping light of an optical amplifier and, an output pulsed light (signal) emitted from the optical amplifier and, a gain value of the optical amplifier and, a master clock signal, in the high power pulsed light generation device of the conventional art, when all the data are started from a timing of start trigger of output pulsed light for high power pulsed light generation device.

As shown in FIG. 7, regarding the gain of the optical amplifier, the peak power of first pulse of the output pulsed light immediately after changing the state of a high power pulsed light generation device from an OFF state to an ON state is lower than peak power (pulse height) in a stable ON state, and then, the peak power of first pulse gradually increases as the pulse is emitted and the power reaches the peak power in a stable state after emitting the pulse several times.

Accordingly, immediately after changing the state of the high power pulsed light generation device from the OFF state to the ON state, a lower power pulse than that of the output pulsed light emitted in a stable state is emitted, and then, the power fluctuates for each pulse until the power reaches the stable state.

The cause that such a phenomenon occurs is considered as follows.

The phenomenon occurs because the gain of the optical amplifier in an OFF state is lower than the minimum gain in a stable ON state (hereinafter, referred to as a stable state).

Further, it is considered that the phenomenon occurs because the pulse width of the pulsed light for pumping output from the pump LD is controlled to be constant by setting the pulse width of the pulsed driving current with respect to the pump LD to be constant at all times.

In a case of FIG. 7, the pulse width of the pulsed light for pumping emitted from the pump LD as described above is controlled to be constant. However, a timing of changing the state of the high power pulsed light generation device from the OFF state to the ON state (timing of an output start trigger) is deviated from a timing of starting the pulse of the master clock signal.

Accordingly, the width of the first pulse of the pulsed light for pumping immediately after the change to the ON state becomes small.

Therefore, the gain of the optical amplifier also becomes extremely small in the first pulse.

As stated above, in the high power pulsed light generation device of the conventional art, the peak power of the output pulsed light fluctuates when changing the state of the high power pulsed light generation device from the OFF state to the ON state.

Accordingly, in case the high power pulsed light generation device of the conventional art is used for laser processing, working efficiency will be reduced. Because, when the peak power of the high power pulsed light generation device is fluctuating just after turning from the OFF state to ON state, the processing must be stopped and wait until the peak power become stable.

The present invention is devised in view of the foregoing problem, and provides a high power pulsed light generation device that can suppress the power fluctuation of the output pulsed light of the high power pulsed light generation device. In this case, the high power pulsed light generation device can stabilize the power of the output pulsed light for each pulse in an early stage, for example, even when changing the state of the high power pulsed light generation device from the OFF state to the ON state, and can prevent the above-described transient phenomenon from occurring.

SUMMARY

The present invention basically solves the problem by providing a configuration that can control the pulse width of the pulsed driving current of the pump LD, change the pulse width of the pulse pump light of the pump LD (pulsed light for pumping), and control the gain of the optical amplifier for each pulse.

A high power pulsed light generation device according to a first aspect of the present invention includes: a master clock generator that generates a master clock signal; an optical oscillator that generates a pulsed light synchronized with the master clock signal; an optical amplifier that amplifies the pulsed light emitted from the optical oscillator to output a high power pulsed light; a pump semiconductor laser that generates a pulsed light for pumping the optical amplifier; a driving unit that drives the pump semiconductor laser by a pulsed driving current synchronized with the master clock signal; and a control unit which controls the driving unit and controls a gain of the optical amplifier for each pulse by changing a pulse width of the pulsed drive current from driving unit so as to change the pulse width of the pumping pulsed light.

It is possible to stabilize peak power of output pulsed light of the high power pulsed light generation device because it is possible to control the gain of the optical amplifier for each pulse using the high power pulsed light generation device described above.

In addition, it is possible to drastically enhance flexibility of the laser processing because it is possible to control the gain of the optical amplifier for each pulse as described above.

Moreover, it is possible to make the start of the output pulsed light easy and fast by synchronizing the pulsed driving current of pump LD and, consequently, the pulsed light for pumping, with the master clock signal and implementing pulse width modulation (PWM).

In the high power pulsed light generation device according to the first aspect of the present invention, it is preferable that the control unit be configured such that, immediately after changing the state of the high power pulsed light generation device from an OFF state where the driving of the pump semiconductor laser stops and the high power pulsed light is not output from the optical amplifier to an ON state where the driving of the pump semiconductor laser starts and the high power pulsed light is output from the optical amplifier, the pulse width of the pulsed light for pumping is adjusted in order for the gain of the optical amplifier immediately before the emission of an output pulsed light to approach the maximum gain in the stable ON state of the optical amplifier.

It is possible to control the gain of the optical amplifier immediately before the emission of the output pulsed light to approach the maximum gain in the stable ON state by adjusting the pulse width of the pulsed light for pumping immediately after changing the state of the high power pulsed light generation device from the OFF state to the ON state using the above-described high power pulsed light generation device.

Accordingly, it is possible to make the peak power of first pulse of the output pulsed light even immediately after the change to the ON state to be substantially equal to the peak power of the output pulsed light in the stable state.

Therefore, an output pulsed light with less fluctuation of the power from the first pulse immediately after the change is obtained and the transient phenomenon as described above is suppressed.

Accordingly, in the laser processing, it is possible to make either the standby period unnecessary or at least a shortened standby period, for example.

In the high power pulsed light generation device according to the first aspect of the present invention, it is preferable that the control unit be configured such that the absolute value of an adjustment width gradually decreases immediately after the change to the ON state when the difference between the pulse width of the pulsed light for pumping immediately after the change to the ON state and the pulse width in the stable ON state is defined as an adjustment width.

In the above-described high power pulsed light generation device, the adjustment width of the pulse width of the pulsed light for pumping of the pump LD for each pulse can be shorter than an adjustment width of the pulse width of the previous pulse.

Therefore, the adjustment width is converged to 0 (zero) in a short time.

As a result, it is possible to stabilize the peak power in a short time.

Moreover, it is possible to input the adjustment width for each pulse during the transient period to the control unit in advance as a data table.

In addition, in this case, since the pulse width of the pulse output of the pump LD is automatically set based on the data table, it is possible to automatically control the pulsed driving current of the pump LD easily.

In the high power pulsed light generation device according to the first aspect of the present invention, it is preferable that the control unit be configured such that a monitor that monitors the output pulsed light is installed in an emission side of the optical amplifier, the monitor measures an amount of light received of the output pulsed light which is incident on the monitor, and the amount of light received measured by the monitor is input to the control unit for the every high power pulsed light emitted from the optical amplifier to control the pulse width of the pulsed light for pumping according to the change of the amount of light received.

It is possible to monitor the emitting power of the output pulsed light for each pulse by the monitor using the high power pulsed light generation device described above.

Further, it is possible to stabilize the peak power of the output pulsed light in a short time according to the change of the emitting power.

In the high power pulsed light generation device according to the first aspect of the present invention, it is preferable that the control unit be configured such that a monitor which monitors the output pulsed light is installed in an emission side of the optical amplifier, the monitor measures an amount of light received of the output pulsed light which enters into the monitor, and the amount of light received measured by the monitor is input to the control unit for the every high power pulsed light emitted from the optical amplifier to control the adjustment width according to the change of the amount of light received.

It is possible to monitor the emitting power of the output pulsed light for each pulse by the monitor using the high power pulsed light generation device described above.

Furthermore, it is possible to stabilize the peak power of the output pulsed light in a shorter time by precisely converging the adjustment width to 0 in a short time according to the fluctuation of the emitting power.

In the high power pulsed light generation device according to the first aspect of the present invention, it is preferable that the control unit be configured such that, immediately after changing the state of the high power pulsed light generation device from an OFF state where the driving of the pump semiconductor laser stops and the high power pulsed light is not emitted from the optical amplifier to an ON state where the driving of the pump semiconductor laser starts and the high power pulsed light is emitted from the optical amplifier, the timing of the output of the pulsed pumping light is adjusted to control the pulse width.

In the high power pulsed light generation device of the present invention, it is possible to change the pulse width of the pulsed output of the pump LD (pulsed pumping light) by controlling the driving current of the pump LD of the optical amplifier of the high power pulsed light generation device, and as a result it is possible to control the power of the output pulsed light for each pulse.

Therefore, it is possible to stabilize the output pulsed light by suppressing the fluctuation of the peak power of the output pulsed light.

Thus, it is possible to stabilize the processing properties using the high power pulsed light generation device of the present invention as the light source for the laser processing, for example. In addition, it is possible to control the gain of the optical amplifier for each pulse, and therefore, it is possible to drastically enhance the flexibility of the laser processing.

DETAILED DESCRIPTION OF THE PREFERRED EMBODIMENTS

A basic principle of the present invention will be described with reference to FIGS. 1 and 2.

Figure 1:
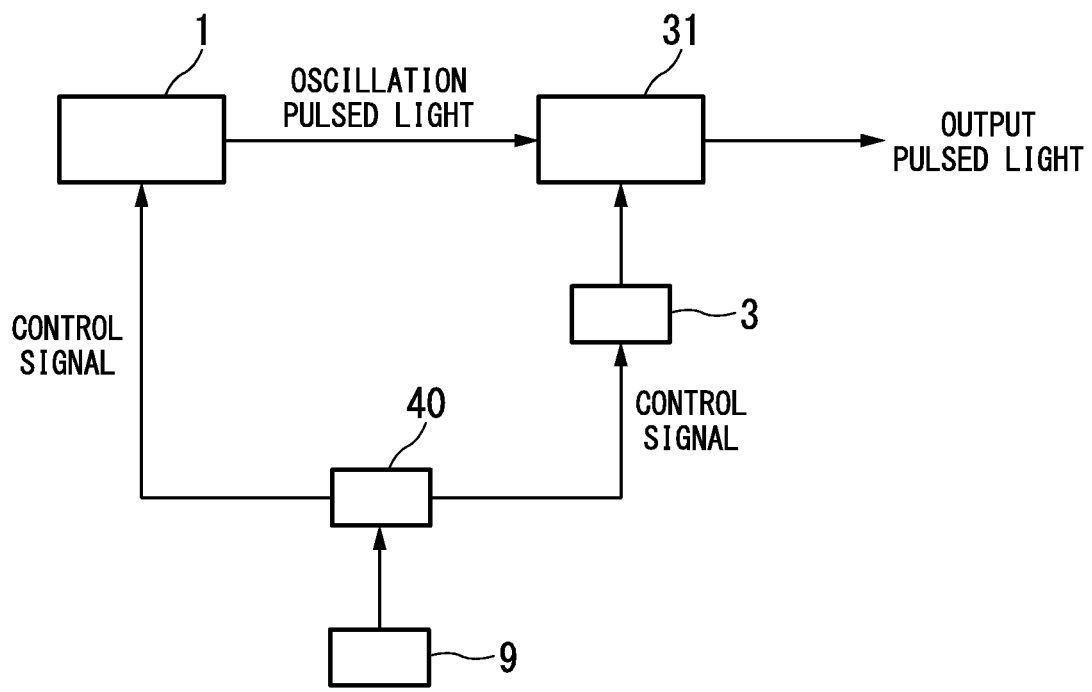
FIG. 1 is a schematic diagram illustrating a basic configuration of a high power pulsed light generation device of the present invention.

FIG. 1 illustrates a basic configuration of a high power pulsed light generation device of the present invention.

In FIG. 1, pulsed light emitted from an optical oscillator 1 of the high power pulsed light generation device (hereinafter, referred to as oscillation pulsed light) is guided to an optical amplifier 31.

In addition, pulsed light for pumping emitted from a pump LD (pump LDs) 3 is given to the optical amplifier 31.

In addition, a pump substance within an amplification medium, which is not shown, is pumped by the oscillation pulsed light and output pulsed light amplified by induced emission is emitted.

A control unit 40 is connected to an optical oscillator 1 and the pump LD 3.

An output control signal that changes the state of the high power pulsed light generation device from an ON state to an OFF state is output to the optical oscillator 1.

A control signal that controls a pulse width of the pulsed light for pumping output from the pump LD is output to the pump LD 3.

Figure 2:
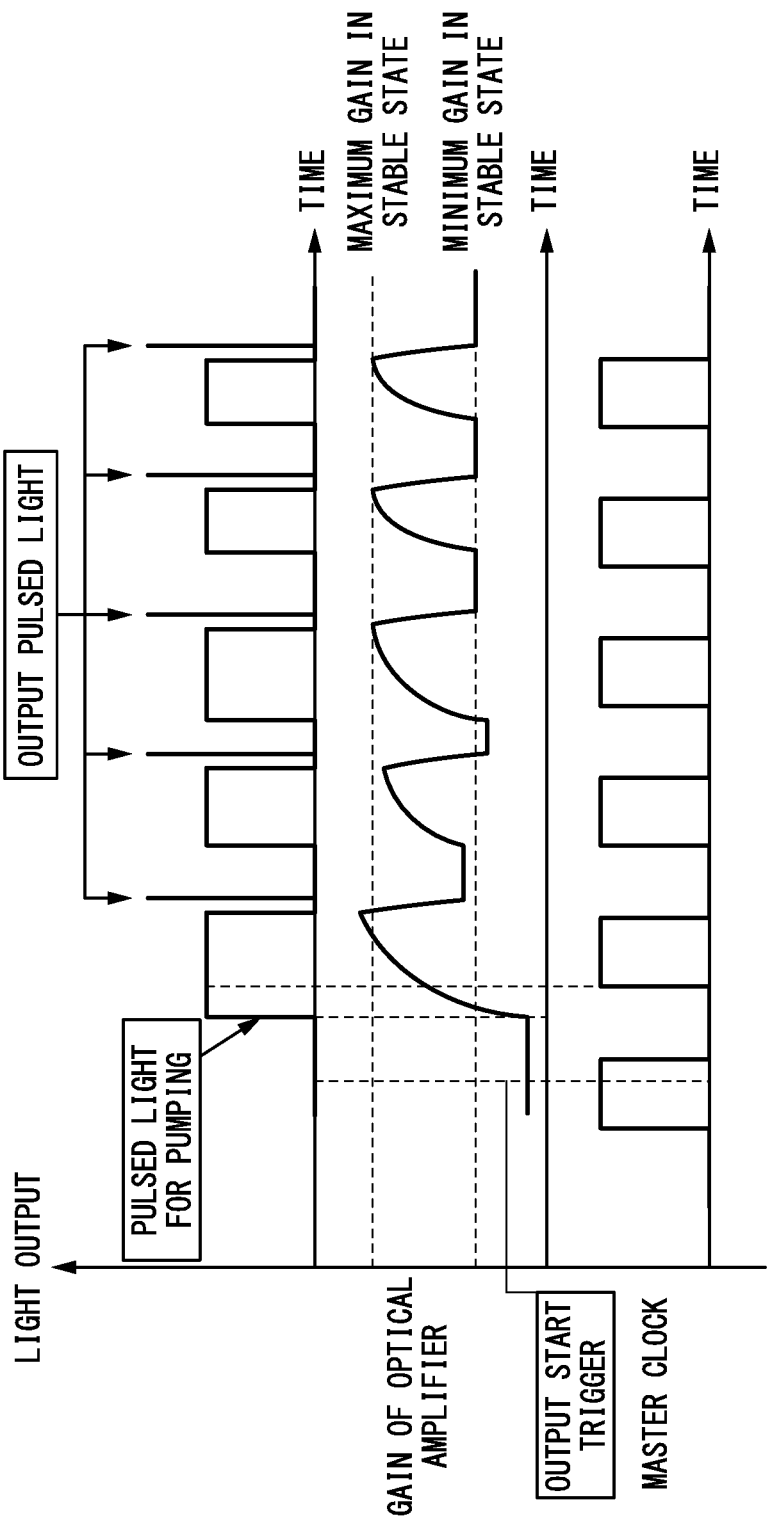
FIG. 2 is a diagram illustrating a relationship among output pulsed light from the high power pulsed light generation device of the present invention, a pulse width of pulsed light for pumping of a pump LD of an optical amplifier, a gain of the optical amplifier and a master clock signal.

FIG. 2 schematically shows: a pulsed light for pumping emitted from a pump LD of an optical amplifier when the state of the high power pulsed light generation device is changed from the ON state where an output start trigger is input to the high power pulsed light generation device, to the OFF state; an output pulsed light emitted from the optical amplifier; a change in gain of the optical amplifier; and a timing of mutual output regarding the master clock signal depending on time.

In addition, a pulsed driving current is controlled by the control unit and the pulsed light for pumping output from the pump LD by synchronizes with the pulsed driving current.

In FIG. 2, the pulse width of the pulsed light for pumping in a first pulse of the output pulsed light is maximized immediately after the output start trigger is input to the control unit, whereas a pulse width of the pulsed light for pumping in a second pulse is shorter than the pulse width of the first pulse as much as a portion in which the gain is slightly overshot in the first pulse.

Further, a pulse width of the pulsed light for pumping of a third pulse is longer than the pulse width of the second pulse as much as a portion in which the gain of the optical amplifier in the second pulse is slightly overshot.

In this manner, it is possible to emit the output pulsed light where the power is even from the first pulse, by changing the pulse width of the pulsed light for pumping to gradually approach the stable pulse width in the ON state.

That is, the pulse width of the pulsed light for pumping emitted from the pump LD is controlled by controlling the pulse width of the pulsed driving current for pumping the pump LD.

Accordingly, the transient phenomenon which has occurred in the high power pulsed light generation device of the conventional art is prevented from occurring.

For the above reasons, the state shown in FIG. 2 should occur in the present invention and the pulse width of the pulsed driving current for driving the pump LD of the optical amplifier is controlled.

Furthermore, in the pulse driving of the pump LD of FIG. 2, the pulse widths of the driving current of the pump LD and the pulsed light for pumping are controlled by the control unit according to a predetermined flow, at the same time when there is a start trigger of driving the pump LD.

Next, detailed embodiments of the present invention will be described below with reference to FIGS. 3 and 4.

Figure 3:
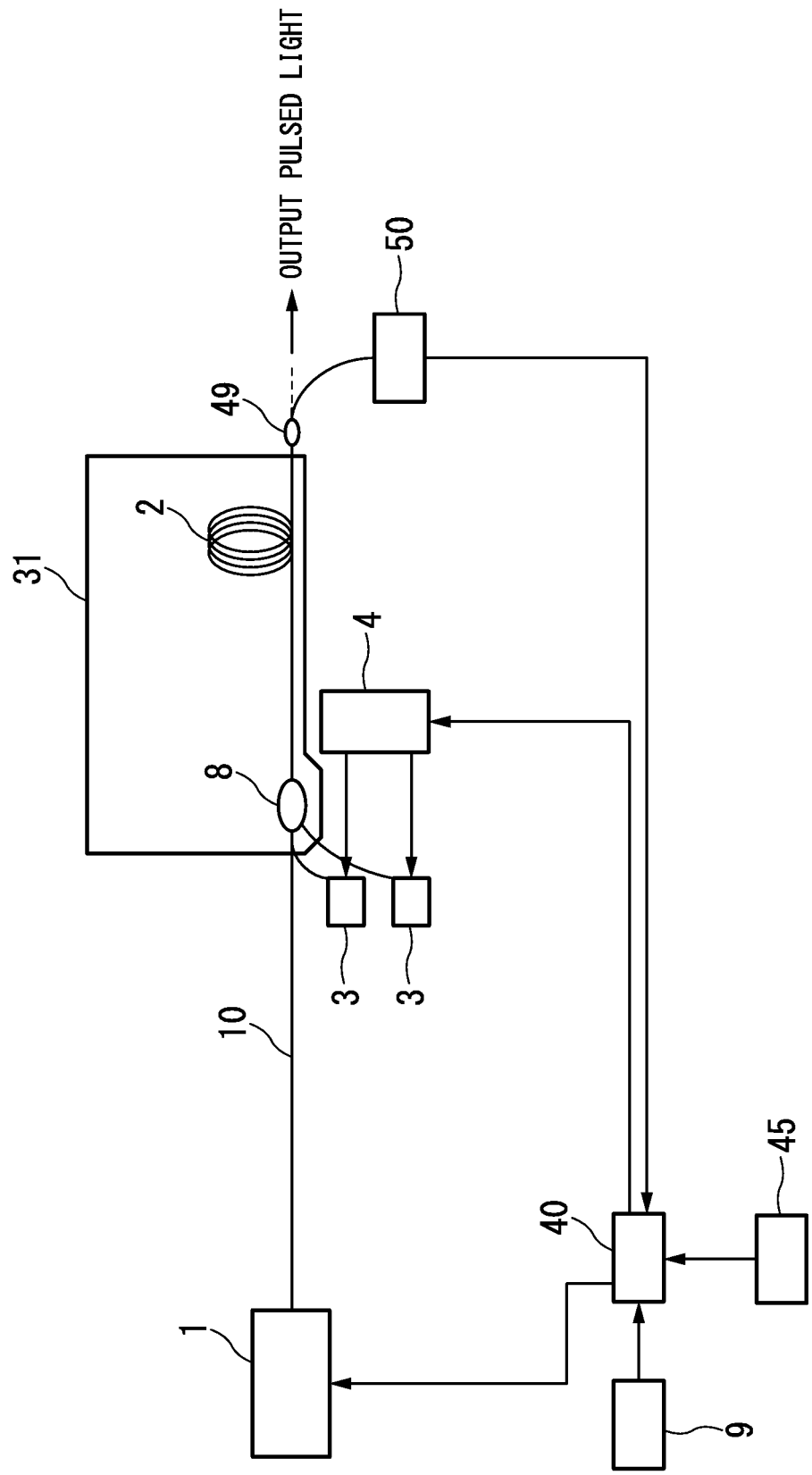
FIG. 3 is a schematic diagram illustrating an overall configuration of the high power pulsed light generation device according to a first embodiment of the present invention.

An embodiment of the high power pulsed light generation device of the present invention is shown in FIG. 3.

The high power pulsed light generation device of the present invention includes an optical fiber 10, an optical oscillator 1, an optical amplifier 31, a control unit 40, and an output pulsed light monitor 50.

The optical amplifier 31 includes a Yb-doped double-clad fiber (DCF) 2 that is an amplification medium, a pump LD 3 that is optically connected to the Yb-doped DCF 2 by a pump LD coupler 8, and a PWM driver 4 (which is to be explained later again with reference to FIG. 4) as a driving unit for driving the pump LD 3.

In addition, the optical oscillator 1 and a driver 4 of the pump LD 3 are connected to the control unit 40 in order to change the state of the high power pulsed light generation device from the ON state to the OFF state, or to receive a control signal related to the pulse width of the pulsed driving current.

The control unit 40 is connected to a master clock generator 9 and an outer controller 45 in order to receive a master clock signal and a signal which is related to an instruction from a user.

Further, the output pulsed light monitor 50 is connected to the Yb-doped DCF via a fiber coupler 49 in order to measure the power of the output pulsed light for each pulse emitted from the optical amplifier 31.

Next, a basic operation and function of the high power pulsed light generation device shown in FIG. 3 will be described below.

An oscillation pulsed light emitted from the optical oscillator 1 is incident on the Yb-doped DCF 2 installed in the optical amplifier 31.

The oscillation pulsed light and the pulsed driving current of pump LD 3 emitted from the PWM driver 4 are controlled by the control unit 40 so as to be synchronized with the master clock signal which is output from the master clock generator 9.

The pulse-modulated driving current (pulsed driving current) is applied to the pump LD 3 and pumping light is emitted from the pump LD 3.

In a case where the pumping light emitted from the pump LD 3 is incident on the Yb-doped DCF 2, Yb elements included in the Yb-doped DCF 2 are pumped, a gain in the Yb-doped DCF 2 is increased to heighten the population inversion rate.

When the oscillation pulsed light emitted from the optical oscillator 1 as described above is incident on the Yb-doped DCF 2 in this state, induced emission is generated, the pulsed light which is amplified from the Yb-doped DCF 2 is emitted from the high power pulsed light generation device as the output pulsed light.

In addition, the instruction from a user to change the state of the high power pulsed light generation device from the ON state to the OFF state is input to the outer controller 45 and is transmitted to the control unit 40.

Next, a PWM operation of the shunt type constant current circuit which functions as the PWM driver 4 which is the driving unit of the pump LD 3 will be described with reference to FIG. 4.

Figure 4:
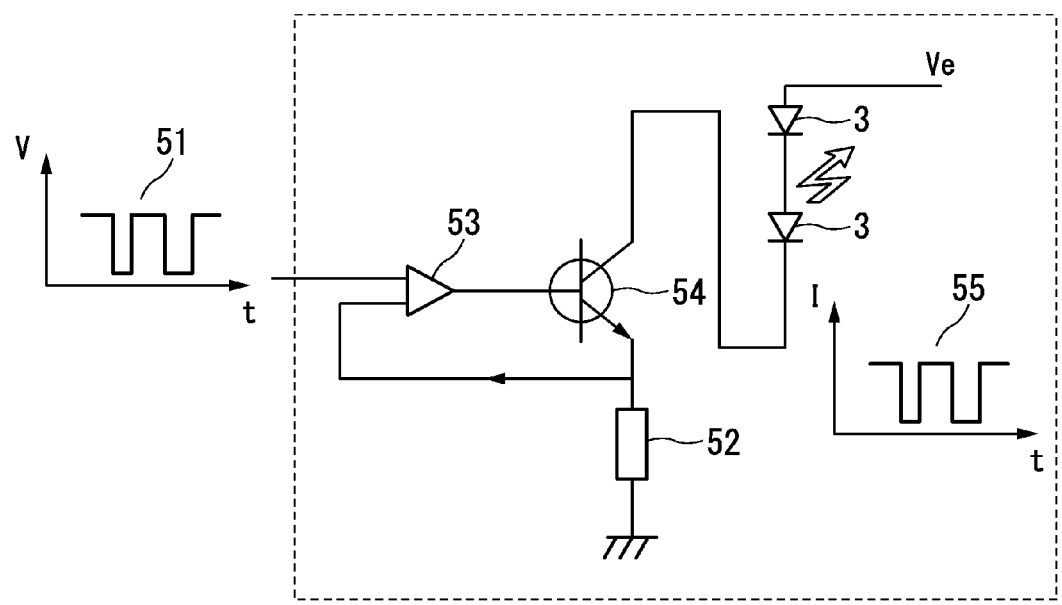
FIG. 4 is a schematic diagram illustrating a basic configuration of a shunt type constant current circuit functioning as a PWM driver of the high power pulsed light generation device according to the first embodiment of the present invention.

The shunt type constant current circuit shown in FIG. 4 is composed of a shunt resistor 52, a comparator 53, and a transistor 54.

It is possible to subject the pulsed driving current of the pump LD to PWM by inputting a voltage to the comparator 53 which determines a set current of a constant current circuit through a voltage pulse signal 51 which is pulse-width modulated.

Moreover, the PWM driver 4 generates the voltage pulse signal 51 that has the adjusted pulse width with respect to a master clock signal pattern which is output from the master clock generator 9 according to a control signal which is output from the control unit 40; and inputs the voltage pulse signal 51 to the PWM driver 4 which is composed of the shunt type constant current circuit.

In the PWM driver 4, the pulsed driving current 55 according to the voltage pulse signal 51 in which the pulse width is modulated flows to the pump LD.

Here, it is desirable to determine the state of switching of the PWM by setting a shunt voltage of the PWM driver 4 as a reference voltage and setting the shunt voltage according to a light emitting threshold current of the pump LD 3.

It is possible to lighten the burden of the pump LD 3 by performing such control and suppressing the overshot due to the switching.

In addition, it is also possible to prevent the output voltage from being affected by temperature characteristics of the pump LD 3 by connecting a temperature compensation device of an output voltage with the pump LD 3 in series and performing a simple voltage control.

In the shunt type constant current circuit in the conventional art, the stability of current tends to deteriorate in general when a time constant is shortened so as to change the ON-OFF state at high speed using the PWM.

In contrast, there is no case where a time-constant current of 1 sec or greater flows in the embodiment.

Accordingly, there is no problem of the stability of the current being deteriorated in the present invention.

Based on the above, a detailed operation in a case where a stop signal of the output pulsed light (hereinafter, referred to as a stop signal) is input to the outer controller 45 and a start signal of the output pulsed light (hereinafter, referred to as a start signal) is subsequently input by a user during the emission of the output pulsed light of the above-described high power pulsed light generation, will be described with reference to FIG. 5.

Figure 5:
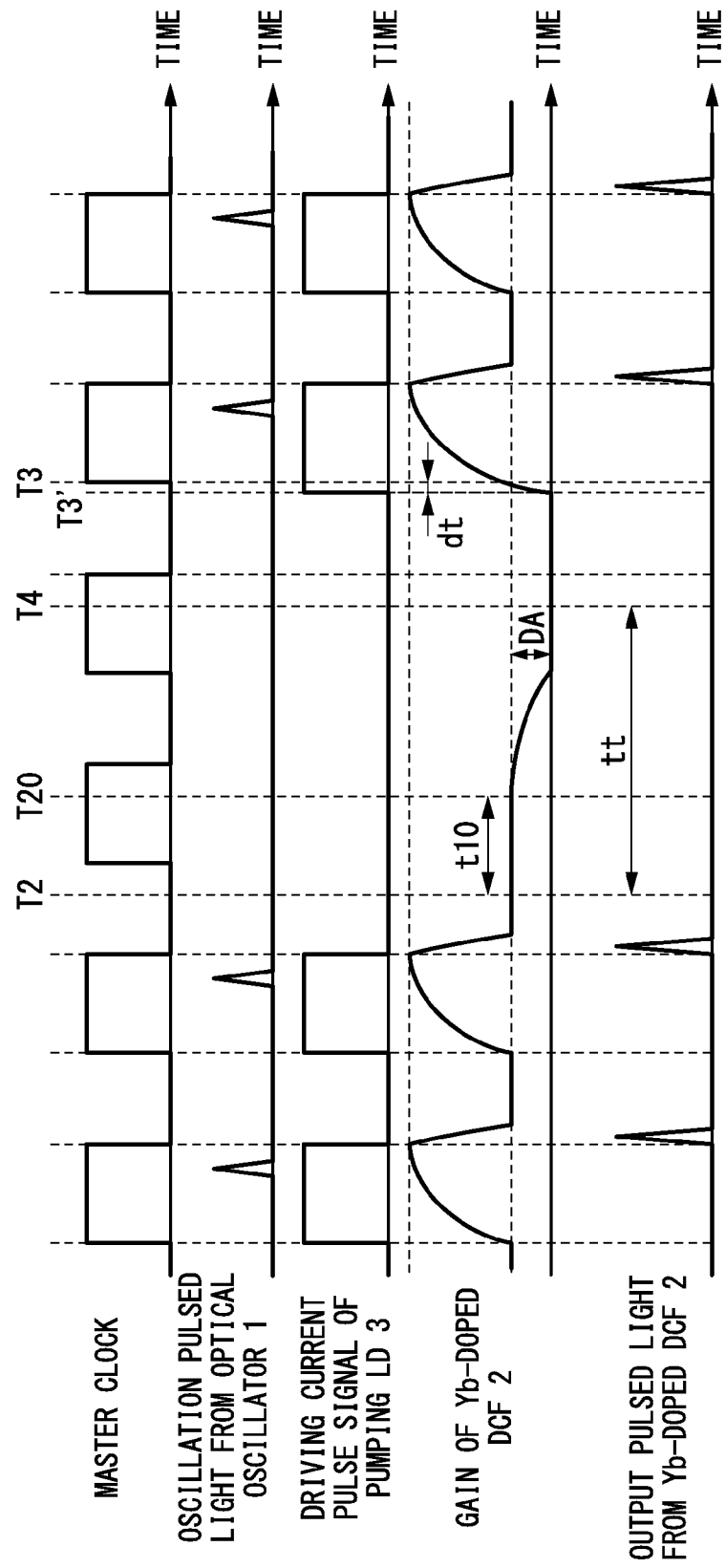
FIG. 5 is a diagram illustrating a method of controlling a pulsed driving current of the pump LD when changing the state of the high power pulsed light generation device from an ON state to an OFF state according to the first embodiment of the present invention.

Furthermore, FIG. 5 shows an example where the pulsed driving current of the pump LD 3 is pulse-modulated with the same frequency as that of the master clock signal. The pulsed driving current may be synchronized with the master clock signal.

Thus, it is possible to control the pulse width of the driving current of the pump LD using the similar control method even if the pulsed driving current is a double wave or a triple wave of the master clock signal.

Here, it is set such that:

T2: a time when the stop signal is input from the outer controller 45 to the control unit 40;

T4: a time when the start signal is input from the outer controller 45 to the control unit 40;

T20: a time elapsed by as much as a gain retention time t10 of the Yb-doped DCF 2 from T2;

t10: the gain retention time of the Yb-doped DCF 2; and tt: the time difference from T2 to T4.

When the stop signal is input from the outer controller 45 to the control unit 40, the output of the pulsed light for pumping of the pump LD 3 becomes low by the control unit 40, and then, the state of the low output of the pulsed light for pumping is maintained until the start signal is input to the control unit 40.

Even in a case where the stop signal or the start signal is input to the outer controller 45, the master clock signal is continuously output in a rectangular pulse pattern which is as the same pattern as that in the stable state.

The gain of the Yb-doped DCF 2 at the time point of T2 is maintained from T2 to T20, and then, is decreased until T4.

Since t10 is an extremely short time, the gain of the Yb-doped DCF 2 at the time point of T4 generally becomes smaller than the maximum gain in the stable state.

When the start signal is input from the outer controller 45 to the control unit 40, the start signal is sent to the optical oscillator 1 and the PWM driver 4 from the control unit 40.

In the control unit 40, the difference between the gain of the Yb-doped DCF 2 in T20 and the minimum gain in the stable state, that is, driving current application time (pulse width) dt for the pump LD 3 which is necessary to recover the decreased amount DA of the gain of the Yb-doped DCF 2 from T20 to T4 is given to the PWM driver 4.

When dt which is driving current application time data for the pump LD 3 is input to the PWM driver 4, the pulse of driving current that has a pulse width where dt is added to the driving current application time in the stable state is applied to the pump LD 3 from the PWM driver 4.

As a result, as shown in FIG. 5, a timing of which the pulse of driving current of the pump LD 3 first starts after T4 (that is, the timing of which the output of the pulsed light for pumping of the pump LD 3) becomes a timing which is ahead by dt from T3 (T3' of FIG. 5).

A pulse, which has a total pulse width where an adjustment width equivalent to dt is added to the pulse width of the pulsed light for pumping in the stable state, that is, to the stable pulse width, is output from the pump LD 3.

In addition, the oscillation pulsed light which is output from the optical oscillator 1 is output at the timing where dt is secured, and the peak power of the oscillation pulsed light is appropriately controlled.

That is, immediately after changing the state of the high power pulsed light generation device from the OFF state where the driving of the pump LD 3 is stopped and the high power pulsed light is not output from the optical amplifier to the ON state where the driving of the pump LD 3 is started and the high power pulsed light is output from the optical amplifier 31, the optical oscillator 1 sets the driving condition of LD 3 to be in a range where the output pulse width can be adjusted by adjusting the timing of the output of the signal pulse together with the timing of the output of the pump LD 3 to be delayed by 1 clock.

The peak power of the output pulsed light immediately after the start signal is input to the control unit 40 becomes substantially equal to the peak power of the output pulsed light in the stable state by the above-described operation.

Here, it is set such that:

t0: a pulse width of the pulsed light for pumping of the pump LD 3 in the stable state;

tm: a pulse width of the pulsed light for pumping of the pump LD 3 when an m-th pulse of the output pulsed light (hereinafter, referred to as the m-th pulse) is emitted after changing the state of the high power pulsed light generation device from the OFF state to the ON state; and Δtm: an adjustment width of the pulsed light for pumping of the pump LD 3 when the m-th pulse is emitted.

At this time, the pulse width tm of the pulsed light for pumping of the pump LD 3 for emitting the m-th pulse is represented by tm=t0+Δtm.

In addition, the pulse width t1 of the first pulse (m=1) is represented by t1=t0+Δt1.

Since the gain of the Yb-doped DCF 2 at the time point of T4 is set lower than the minimum gain in the stable state, it is set as Δt1>0 in order to make the gain of the Yb-doped DCF 2 immediately before the first pulse emission approach the maximum gain of the Yb-doped DCF 2 in the stable state.

Next, the pulse width t2 of the second pulse (m=2) is represented by t2=t0+Δt2.

Immediately after the first pulse is emitted, when the gain of the Yb-doped DCF 2 is higher than the minimum gain in the stable state, the gain of the Yb-doped DCF 2 immediately before the emission of the second pulse becomes higher than the maximum gain of the Yb-doped DCF 2 in the stable state by the setting of Δt2=0.

Figure 6A:
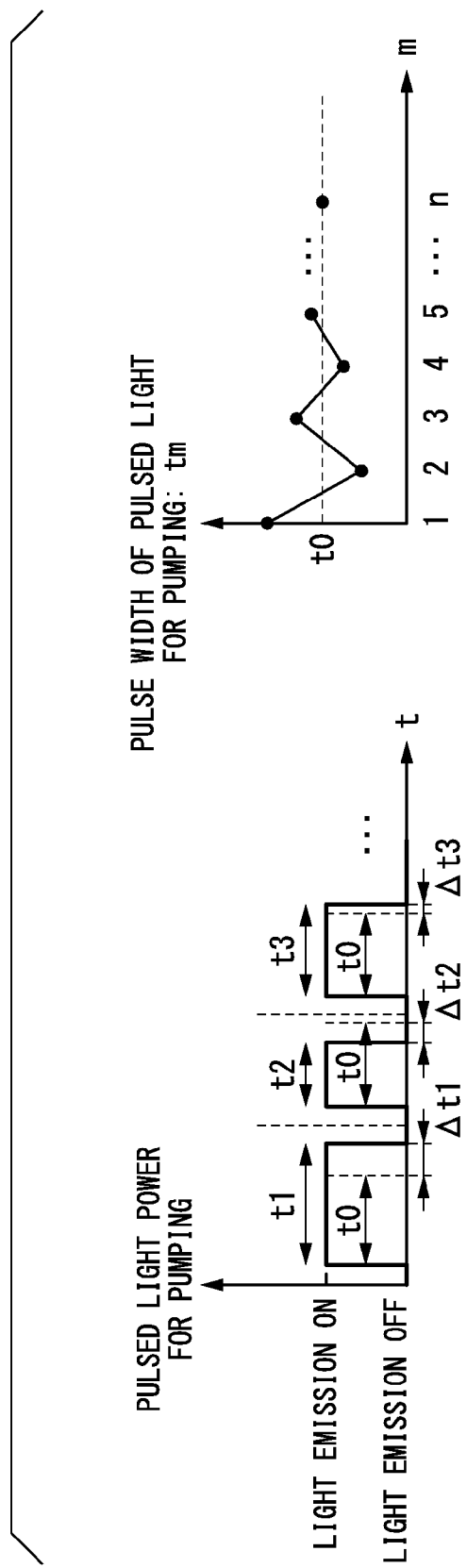
FIG. 6A is a diagram illustrating an example of controlling and adjusting a pulse width of a pulse output of the pump LD in the high power pulsed light generation device according to the first embodiment of the present invention.

In this case, the gain of the Yb-doped DCF 2 immediately before the emission of the second pulse approaches the gain of the Yb-doped DCF 2 in the stable state by the setting of Δt2<0 as shown in FIG. 6A.

With respect to the case of FIG. 6A, when the gain of the Yb-doped DCF 2 immediately after the emission of the first pulse becomes lower than the minimum gain in the stable state, the gain of the Yb-doped DCF 2 immediately before the emission of the second pulse becomes lower than the minimum gain of the Yb-doped DCF 2 in the stable state by the setting of Δt2=0.

Figure 6B:
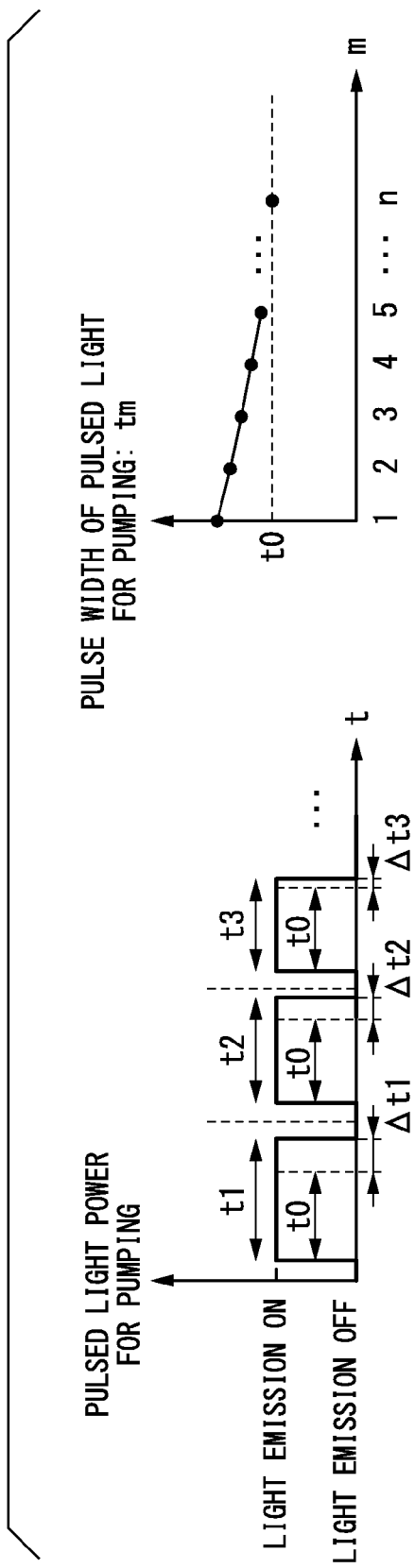
FIG. 6B is a diagram illustrating another example of controlling and adjusting the pulse width of the pulse output of the pump LD in the high power pulsed light generation device according to the first embodiment of the present invention.
Figure 7:
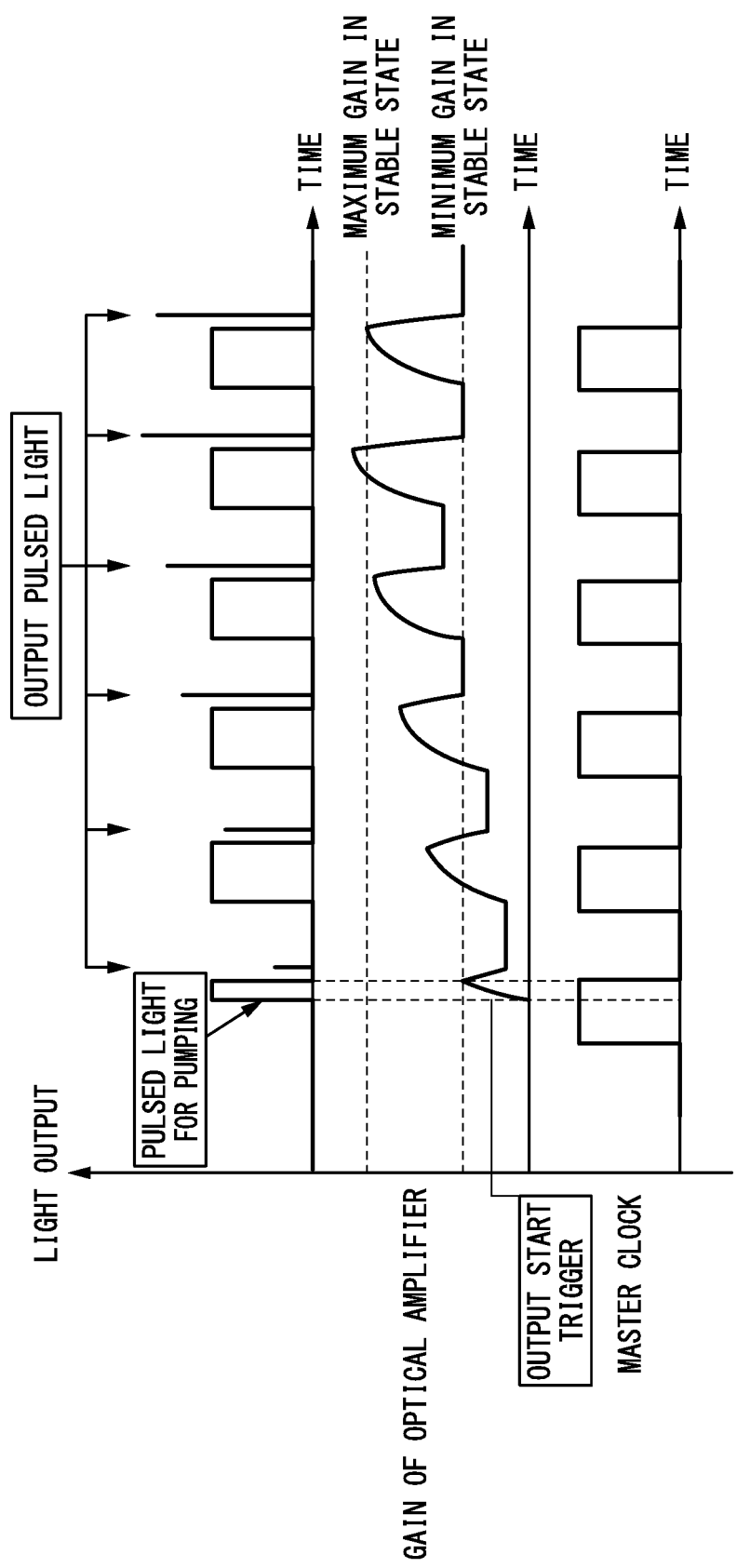
FIG. 7 is a diagram illustrating a relationship among output pulsed light in the high power pulsed light generation device of the conventional art, the pulse width of the pulsed light for pumping of the pump LD of the optical amplifier, the gain of the optical amplifier, and a master clock signal.

In this case, the gain of the Yb-doped DCF 2 immediately before the emission of the second pulse approaches the gain of the Yb-doped DCF 2 in the stable state by the setting of Δt2>0 as shown in FIG. 6B.

Similarly to the previous case, the pulse width tm of the pulsed light for pumping of the pump LD 3 for emitting the m-th pulse after the third pulse is controlled by the control unit through the PWM driver 4.

That is, Δtm (m=1 to n) is determined by the method of controlling the pulse width of the pulsed light for pumping of the pump LD 3 as shown in any of FIGS. 6A and 6B. In addition, the pulse width of the pulsed light for pumping of the pump LD 3 is controlled to be |Δt1|>|Δt2|>|Δt3> . . . |Δt(n−1)|>|Δtn|=0.

As a result, immediately after changing the state of the high power pulsed light generation device from the OFF state to the ON state, the pulse of the output pulsed light of the power which is the same as that in the stable state is emitted.

Since the above-described control is performed by feed-forward, it is necessary to input values of n adjustment widths between Δt1 to Δtn to the control unit in advance as a data table before using the high power pulsed light generation device.

The pulsed driving current of the pump LD 3 which is the same as that in the stable state is controlled regarding the emission after the (n+1)th pulse of the output pulsed light.

Further, in the high power pulsed light generation device of the embodiment, the output pulsed light monitor 50 is connected to an emission unit of the Yb-doped DCF 2 via the fiber coupler 49 as shown in FIG. 3.

It is possible to apply a photo-detector or the like as the output pulsed light monitor 50.

Immediately after changing the state of the high power pulsed light generation device from the OFF state to the ON state, the power of the output pulsed light for each pulse is measured using the output pulsed light monitor 50 and the measured power of the output pulsed light (an amount of light received) is input for each pulse to the control unit.

Next, the control unit determines the value of the adjustment width Δtm of the pump LD 3 for emitting the m-th pulse of the output pulsed light from the amount of light received.

The determined Δtm value is output to the PWM driver 4 and the pulse width of the pulsed light for pumping of the pump LD 3 is adjusted in the PWM driver 4 to accurately converge Δtm to 0 in short time.

It is possible to obtain an output pulsed light with less fluctuation of the power from the high power pulsed light generation device by performing such control.

As described above, the pulse width of the pulsed light for pumping of the pump LD 3 is adjusted by adjusting the pulse width of the pulsed driving current for pumping the pump LD 3 which is output from the PWM driver 4, using the control unit 40. In addition, even immediately after changing the state of the high power pulsed light generation device from the ON state to the OFF state, the fluctuation of the emitted power of the output pulsed light for each pulse can be suppressed.

Moreover, it is possible to control the emitted power of the output pulsed light for each pulse by freely operating control parameters such as dt.

The description of preferable embodiments of the present invention has been provided, but the present invention is not limited to the embodiments.

Any addition, omission, replacement, and other modifications of the configurations can be made within the range not departing from the gist of the present invention.

In addition, the high power pulsed light generation device of the present invention is ideal for the light source for laser processing, but is not limited thereto. It is possible to be utilized for any application that requires the high power pulsed light.

What is claimed is:

1. A high power pulsed light generation device comprising:
  a master clock generator that generates a master clock signal;
  an optical oscillator that generates a pulsed light synchronized with the master clock signal;
  an optical amplifier that amplifies the pulsed light emitted from the optical oscillator to output a high power pulsed light;
  a pump semiconductor laser that generates a pulsed light for pumping the optical amplifier;
  a driving unit that drives the pump semiconductor laser by a pulsed driving current synchronized with the master clock signal; and
  a control unit which controls the driving unit and controls a gain of the optical amplifier for each pulse by changing a pulse width of the pulsed drive current from driving unit so as to change the pulse width of the pumping pulsed light;
  wherein the control unit is configured such that immediately after changing the state of the high power pulsed light generation device from an OFF state to an ON state, the pulse width of the pulsed light for pumping corresponding to a first pulse of the output pulsed light from the optical amplifier is longer than the pulse width of the pulsed light for pumping in a stable ON state of the optical amplifier; and
  wherein the OFF state is a state in which the driving of the pump semiconductor laser is stopped and the high power pulsed light is not output from the optical amplifier, and the ON state is a state in which the driving of the pump semiconductor laser is started and the high power pulsed light is output from the optical amplifier.

2. The high power pulsed light generation device according to claim 1,
  wherein the control unit is configured such that the absolute value of an adjustment width gradually decreases immediately after the change to the ON state when the difference between the pulse width of the pulsed light for pumping immediately after the change to the ON state and the pulse width in the stable ON state is defined as the adjustment width.

3. The high power pulsed light generation device according to claim 1,
wherein the control unit is configured such that a monitor that monitors the output pulsed light is installed in an emission side of the optical amplifier,
the monitor measures an amount of light received of the output pulsed light which is incident on the monitor, and
the amount of light received measured by the monitor is input to the control unit for the every high power pulsed light emitted from the optical amplifier to control the pulse width of the pulsed light for pumping according to the change of the amount of light received.

4. The high power pulsed light generation device according to claim 2,
wherein the control unit is configured such that a monitor which monitors the output pulsed light is installed in an emission side of the optical amplifier,
the monitor measures an amount of light received of the output pulsed light which is incident on the monitor, and
the amount of light received measured by the monitor is input to the control unit for the every high power pulsed light emitted from the optical amplifier to control the adjustment width according to the change of the amount of light received.

5. The high power pulsed light generation device according to claim 1,
wherein the optical oscillator is configured such that, immediately after changing the state of the high power pulsed light generation device from the OFF state to the ON state, the timing of the output of the pulsed light for pumping is adjusted to control the pulse width, a timing at which the pulsed light synchronized with the master clock signal is output is after a timing at which the output of the pulsed light for pumping is output.

* * * * *